United States Patent
Silva et al.

(10) Patent No.: US 11,259,413 B2
(45) Date of Patent: Feb. 22, 2022

(54) INDUCTIVELY BALANCED POWER SUPPLY CIRCUIT AND METHOD OF MANUFACTURE

(71) Applicant: ABB Schweiz AG, Baden (CH)

(72) Inventors: Arturo Silva, Allen, TX (US); Loc Ngo, Carrollton, TX (US)

(73) Assignee: ABB Power Electronics Inc., Plano, TX (US)

( * ) Notice: Subject to any disclaimer, the term of this patent is extended or adjusted under 35 U.S.C. 154(b) by 715 days.

(21) Appl. No.: 15/946,151

(22) Filed: Apr. 5, 2018

(65) Prior Publication Data
US 2019/0313531 A1    Oct. 10, 2019

(51) Int. Cl.
| H01F 27/24 | (2006.01) |
| H05K 1/18 | (2006.01) |
| H01F 27/28 | (2006.01) |
| H02M 1/14 | (2006.01) |
| H05K 3/30 | (2006.01) |

(52) U.S. Cl.
CPC ............ *H05K 1/181* (2013.01); *H01F 27/24* (2013.01); *H01F 27/28* (2013.01); *H02M 1/14* (2013.01); *H05K 3/303* (2013.01); *H05K 2201/1003* (2013.01); *H05K 2201/10522* (2013.01)

(58) Field of Classification Search
CPC ........ H05K 1/181; H05K 3/303; H01F 27/24; H01F 27/28; H01F 27/306; H01F 3/12; H01F 27/2847; H02M 1/14
USPC ....................................... 336/212, 200, 84 M
See application file for complete search history.

(56) References Cited

U.S. PATENT DOCUMENTS

| 4,262,328 A | 4/1981 | Bloom et al. |
| 4,491,819 A | 1/1985 | Ray |
| 4,703,409 A | 10/1987 | Spreen |
| 6,163,466 A | 12/2000 | Davila, Jr. et al. |
| 6,323,626 B1 | 11/2001 | Raiser |
| 6,480,088 B2 * | 11/2002 | Okamoto ................ H01F 17/04 336/208 |
| 6,535,407 B1 | 3/2003 | Zaitsu |
| 6,549,436 B1 | 4/2003 | Sun |
| 6,696,902 B2 | 2/2004 | Lerke et al. |

(Continued)

FOREIGN PATENT DOCUMENTS

| CN | 102664527 A | 9/2012 |
| CN | 202737745 U | 2/2013 |

(Continued)

*Primary Examiner* — Shawki S Ismail
*Assistant Examiner* — Kazi S Hossain
(74) *Attorney, Agent, or Firm* — Armstrong Teasdale LLP

(57) ABSTRACT

A power supply circuit includes a printed circuit board (PCB), and a transformer coupled to the PCB. The power supply circuit also includes a first inductor assembly coupled to the PCB and electrically connected to the transformer, and a second inductor assembly coupled to the PCB and electrically connected to the transformer. The first inductor assembly has an inner edge and an opposite outer edge, and the second inductor assembly has an inner edge and an opposite outer edge. The inner edge of the second inductor assembly is spaced apart from the inner edge of the first inductor assembly by a gap. The power supply circuit also includes a first magnetic shunt coupled to the outer edge of the first inductor assembly, and a second magnetic shunt coupled to the outer edge of the second inductor assembly.

17 Claims, 5 Drawing Sheets

(56) References Cited

U.S. PATENT DOCUMENTS

| | | |
|---|---|---|
| 6,784,644 B2 | 8/2004 | Xu et al. |
| 7,170,268 B2 | 1/2007 | Kim |
| 7,362,598 B2 | 4/2008 | Schaible et al. |
| 7,365,624 B2 | 4/2008 | Young et al. |
| 7,449,867 B2 | 11/2008 | Wu et al. |
| 7,596,006 B1 | 9/2009 | Granat |
| 7,821,799 B2 | 10/2010 | Jacobs |
| 7,880,577 B1 | 2/2011 | Glaser et al. |
| 8,169,335 B2 | 5/2012 | Frederick et al. |
| 8,258,827 B2 | 9/2012 | Chang et al. |
| 8,339,211 B2 | 12/2012 | Lu et al. |
| 8,772,967 B1 | 7/2014 | Ikriannikov et al. |
| 8,947,074 B1 | 2/2015 | Youngquist et al. |
| 9,082,543 B2 | 7/2015 | Ohtomo et al. |
| 9,118,259 B2 | 8/2015 | Ye |
| 9,276,616 B2 | 3/2016 | Story |
| 9,825,544 B2 | 11/2017 | Marrero |
| 2005/0270806 A1* | 12/2005 | Zhu .................. H02M 3/33576 363/17 |
| 2008/0084717 A1 | 4/2008 | Wu et al. |
| 2013/0181535 A1* | 7/2013 | Muratov ................ H02J 7/025 307/104 |
| 2014/0266556 A1* | 9/2014 | Krahn ................ H01F 41/0206 336/220 |
| 2015/0035625 A1 | 2/2015 | Ohtomo et al. |
| 2015/0155092 A1* | 6/2015 | Murtagian ............ H01F 27/292 336/192 |
| 2016/0276097 A1* | 9/2016 | Lewis ................ H01F 17/0006 |
| 2016/0294189 A1 | 10/2016 | Uno et al. |

FOREIGN PATENT DOCUMENTS

| | | |
|---|---|---|
| CN | 103384075 A | 11/2013 |
| CN | 106655821 A | 5/2017 |
| CN | 106655831 A | 5/2017 |
| CN | 106655832 A | 5/2017 |
| CN | 106685248 A | 5/2017 |
| CN | 106877702 A | 6/2017 |
| CN | 107070265 A | 8/2017 |
| CN | 206585478 U | 10/2017 |
| CN | 206620064 U | 11/2017 |
| CN | 206620066 U | 11/2017 |
| CN | 206686096 U | 11/2017 |
| JP | H11187657 A | 7/1999 |
| KR | 100732612 B1 | 6/2007 |
| KR | 100988324 B1 | 10/2010 |
| TW | I458248 B | 10/2014 |
| WO | 2006024968 A1 | 3/2006 |
| WO | 2016150245 A1 | 9/2016 |

* cited by examiner

INDUCTIVELY BALANCED POWER SUPPLY CIRCUIT AND METHOD OF MANUFACTURE

BACKGROUND

The field of disclosure relates generally to a power supply circuit and method of manufacturing the same. More particularly, the field of disclosure relates to an inductively balanced power supply circuit that includes a first current doubling circuit and a second current doubling circuit.

Power supply circuits, such as DC-DC converters, are used throughout the electronics industry and are designed to convert an input direct current (DC) voltage to a higher or lower output DC voltage. For example, many modern microprocessors, such as those installed in power-dense rack-mounted server systems, require extremely low input voltages and high input currents. Common conversion ratios are, for example, in the range of 48:12, with currents ranging in the fifties or hundreds of amps. In addition, because input voltage requirements have trended into such low ranges, modern converters must be able to constrain ripple voltages to very minimal levels (e.g., typically, less than 100 millivolts).

To accommodate these power requirements, various converter architectures have been developed. One such architecture, commonly referred to as a "current-doubler," has been extensively used in many converter topologies. In general, current-doublers may include two diode-inductor pairs coupled in parallel and connected to a secondary winding of a converter transformer. Advantages include ripple voltage cancellation, high current handling capability, and doubled current on the converter output.

Notwithstanding these advantages, however, increased power demands have led to the development of various so-called "double current-doublers." As the name suggests, a double current-doubler is a power supply circuit that includes a pair of current doubling circuits connected in parallel, such that an input current is effectively quadrupled on the output side of the converter. Drawbacks associated with many common double current-doublers include, for example, that the inductors of each current-doubler are disposed in close proximity (e.g., to accommodate a power dense converter architecture) and tend to magnetically couple during operation, such that ripple current on the output side of the converter is disadvantageously increased. One solution has been to physically separate the current-doublers, one from the other, by a substantial distance, that prevents, or at least substantially limits, magnetic coupling between the current-doublers. However, this solution results is a less power dense converter architecture and is therefore undesirable.

An inductively balanced power supply circuit is therefore desirable. More particularly, an inductively balanced double current-doubler is desirable, in which each current-doubler is positioned in relatively close proximity to the other to maintain a power-dense converter architecture without sacrificing a low, stable, low-ripple, output voltage and high output current.

BRIEF DESCRIPTION

In one aspect, a power supply circuit is provided. The power supply circuit includes a printed circuit board (PCB), and a transformer coupled to the PCB. The power supply circuit also includes a first inductor assembly coupled to the PCB and electrically connected to the transformer, and a second inductor assembly coupled to the PCB and electrically connected to the transformer. The first inductor assembly has an inner edge and an opposite outer edge, and the second inductor assembly has an inner edge and an opposite outer edge. The inner edge of the second inductor assembly is spaced apart from the inner edge of the first inductor assembly by a gap. The power supply circuit also includes a first magnetic shunt coupled to the outer edge of the first inductor assembly, and a second magnetic shunt coupled to the outer edge of the second inductor assembly.

In another aspect, a power supply circuit is provided. The power supply circuit includes a transformer comprising a first secondary winding and a second secondary winding, a first inductor assembly electrically connected to the first secondary winding of the transformer, and a second inductor assembly electrically connected to the second secondary winding of the transformer. The first inductor assembly includes a first inductor, a second inductor electrically connected in parallel with the first inductor, and a first magnetic shunt arranged to magnetically couple with the first inductor during operation. Likewise, the second inductor assembly includes a third inductor, a fourth inductor electrically connected in parallel with the third inductor, and a second magnetic shunt arranged to magnetically couple with the fourth inductor during operation.

In yet another aspect, a method for inductively balancing a power supply circuit that includes a first inductor assembly and a second inductor assembly is provided. The method includes: (i) mounting the first inductor assembly on a printed circuit board (PCB), (ii) mounting the second inductor assembly on the PCB, (iii) mounting a first magnetic shunt on the PCB, (iv) mounting a first magnetic shunt on the PCB in a first location that facilitates magnetic coupling between the first magnetic shunt and the first inductor assembly; and (v) mounting a second magnetic shunt on the PCB in a second location that facilitates magnetic coupling between the second magnetic shunt and the second inductor assembly, wherein a mutual inductance between the first inductor assembly and the second inductor assembly is balanced by the addition of the first magnetic shunt and the second magnetic shunt.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

Embodiments of the present disclosure relate to an inductively balanced power supply circuit, such as a double current-doubler. The power supply circuit includes a first inductor assembly that includes a first inductor and a second inductor, and a second inductor assembly that includes a third inductor and a fourth inductor. The inductor assemblies are positioned close to one another on a printed circuit board, such that the second and third inductors are able to magnetically couple during operation. This form factor increases the power density of the power supply circuit. To balance the mutual inductance established between the second and third inductors, a first magnetic shunt is added in proximity to the first inductor, and second magnetic shunt is added in proximity to the fourth inductor.

Figure 1:
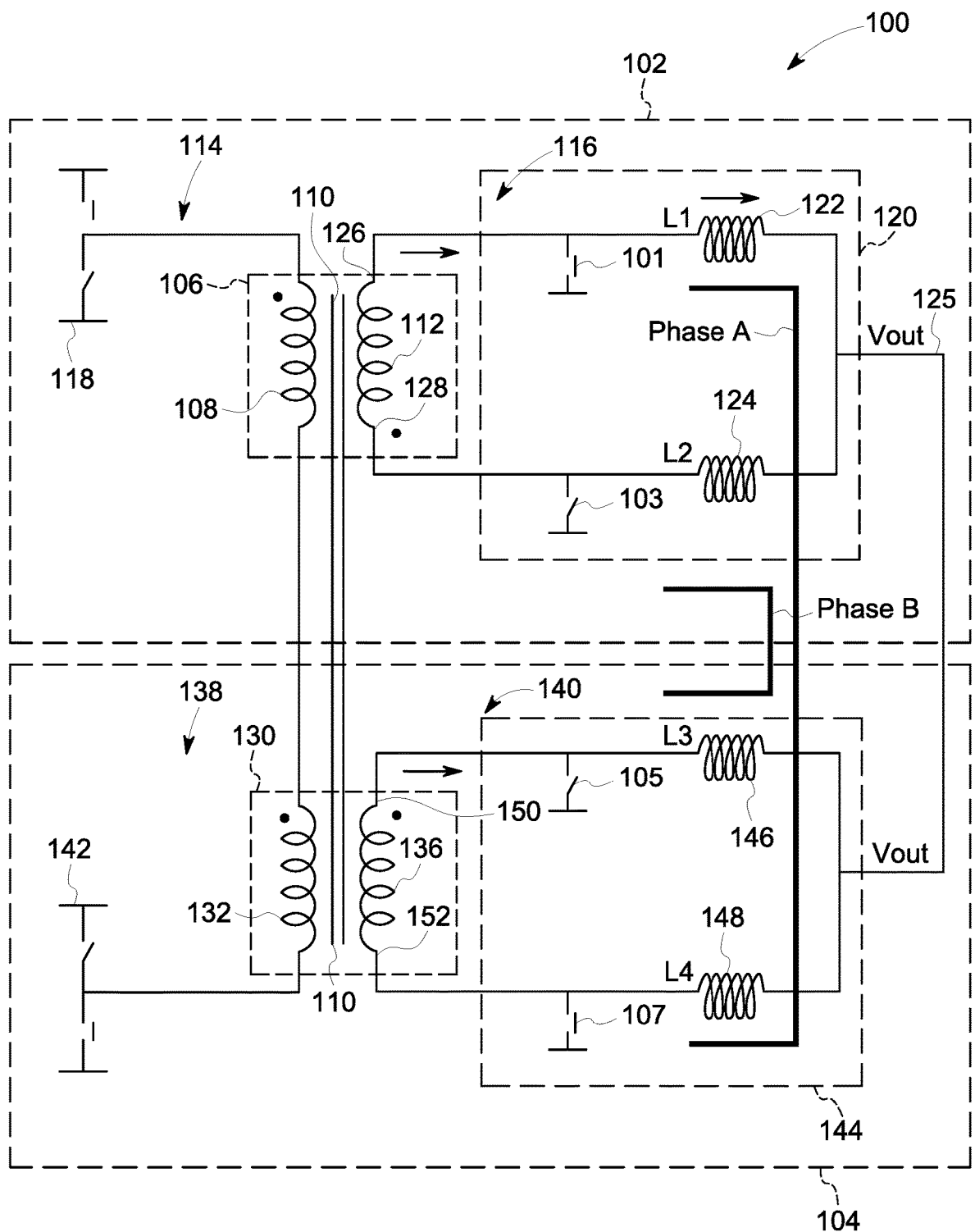
FIG. 1 is a circuit diagram of an exemplary inductively balanced power supply circuit that includes two current-doublers.

FIG. 1 is a circuit diagram of an exemplary inductively balanced power supply circuit 100. Specifically, power supply circuit 100 includes a first current-doubler 102 and a second current-doubler 104 connected in parallel with first current-doubler 102. As such, power supply circuit 100 may be referred to herein as a double current-doubler.

First current-doubler 102 includes a first transformer 106 that includes a primary winding 108, a transformer core 110, and a secondary winding 112. First transformer 106 electrically isolates a primary side 114 of first current-doubler 102 from a secondary side 116. On primary side 114, a first switch 118, such as a MOSFET, is coupled to an input DC voltage source, such as an output side of an AC-DC converter. On secondary side 116, a first inductor assembly 120 is electrically connected to secondary winding 112.

First inductor assembly 120 includes a first inductor 122 (or "L1") and a second inductor 124 (or "L2"). Specifically, first inductor 122 is connected between an output current bus 125 and a first end 126 of secondary winding 112, and second inductor 124 is connected between output current bus 125 and a second end 128 of secondary winding 112.

In the exemplary embodiment, a first secondary-side switch 101 is electrically coupled between first end 126 of secondary winding 112 and first inductor 122, and a second secondary-side switch 103 is electrically coupled between second end 128 of secondary winding 112 and second inductor 124. First secondary-side switch 101 and second secondary-side switch 103 may include any suitable switching element, such as any MOSFET, and may be opened and closed to switch first inductor 122 and second inductor 124 into and out of the circuit to transition, as described below, between conduction and non-conduction phases.

Second current-doubler 104 includes a second transformer 130 that includes a primary winding 132 and a secondary winding 136 wound on transformer core 110. In this regard, first transformer 106 and second transformer 130 may be regarded as distinct transformers mounted on a common core 110, such as, in at least some embodiments, an E-core, a U-I core, and/or any other suitably shaped core. In other embodiments, first transformer 106 and second transformer 130 may include separate cores, and the primary windings of each transformer 106 and 130 may be electrically connected in series. Second transformer 130 electrically isolates a primary side 138 of second current-doubler 104 from a secondary side 140. On primary side 138, a second switch 142, such as a MOSFET, is coupled to an input DC voltage source, such as an output side of an AC-DC converter. On secondary side 140, a second inductor assembly 144 is electrically connected to secondary winding 136.

Second inductor assembly 144 includes a third inductor 146 (or "L3") and a fourth inductor 148 (or "L4"). Specifically, third inductor 146 is connected between output current bus 125 and a first end 150 of secondary winding 136, and fourth inductor 148 is connected between output current bus 125 and a second end 152 of secondary winding 136.

In the exemplary embodiment, a third secondary-side switch 105 is electrically coupled between first end 150 of secondary winding 136 and third inductor 146, and a fourth secondary-side switch 107 is electrically coupled between second end 152 of secondary winding 136 and fourth inductor 148. Third secondary-side switch 105 and fourth secondary-side switch 107 may include any suitable switching element, such as any MOSFET, and may be opened and closed to switch third inductor 146 and fourth inductor 148 into and out of the circuit to transition, as described below, between conduction and non-conduction phases.

In the exemplary embodiment, a nominal inductor value of first inductor 122 and second inductor 124 is approximately 120 nano-henries (nH). Likewise, a nominal inductor value of third inductor 146 and fourth inductor 148 is approximately 120 nH. When first inductor assembly 120 and second inductor assembly 144 are mounted on PCB 202 (as described below), a mutual inductance of second inductor 124 and third inductor 146 is approximately 170 nH, while a mutual inductance of first inductor 122 and fourth inductor 148 remains at approximately 120 nH. However, with the addition of a first magnetic shunt 214 and a second magnetic shunt 216 (as described below), a mutual inductance of first inductor 122 and fourth inductor 148 is approximately 170 nH. As described below, these values may vary during conduction and non-conduction phases of operation.

Briefly, and in operation, first secondary-side switch 101, second secondary-side switch 103, third secondary-side switch 105, and fourth secondary-side switch 107 are controlled, such as by a microprocessor of power supply circuit 100, to alternatingly supply electrical current to first inductor 122 and fourth inductor 148 at the same time, or during a first power supply phase (e.g., "Phase A"). Likewise, first secondary-side switch 101, second secondary-side switch 103, third secondary-side switch 105, and fourth secondary-side switch 107 are controlled, such as by the microprocessor, to alternatingly supply electrical current to second inductor 124 and third inductor 146 at the same time, or during a second power supply phase (e.g., "Phase B"). Specifically, switches 101 and 107 are opened and closed in tandem to electrically couple first inductor 122 and fourth inductor 148 in parallel during power supply (or conduction) Phase A. Likewise, switches 103 and 105 are opened and closed in tandem to electrically couple second inductor 124 and third inductor 146 in parallel during power supply (or conduction) Phase B. In other words, switches 101 and 107 are closed during Phase A and opened during Phase B, while switches 103 and 105 are opened during Phase A and closed during Phase B.

During each power supply phase, each current-doubler 102 and 104 thus contributes electrical current to output current bus 125, and in total, the output current is quadrupled by the combination of dual current-doublers 102 and 104. Additional detail regarding the physical structure and operation of each current-doubler 102 and 104 is not central to an understanding of the present invention and is not therefore described in greater detail herein. Rather, it is sufficient to note that each current-doubler 102 and 104 contributes a portion of the total output current during a respective power supply phase A and B. However, additional detail may be obtained with reference to U.S. patent application Ser. No. 15/657,786, entitled SINGLE-STAGE DC-DC POWER CONVERTER, filed Jul. 24, 2017, which is hereby incorporated by reference in its entirety.

Figure 2:
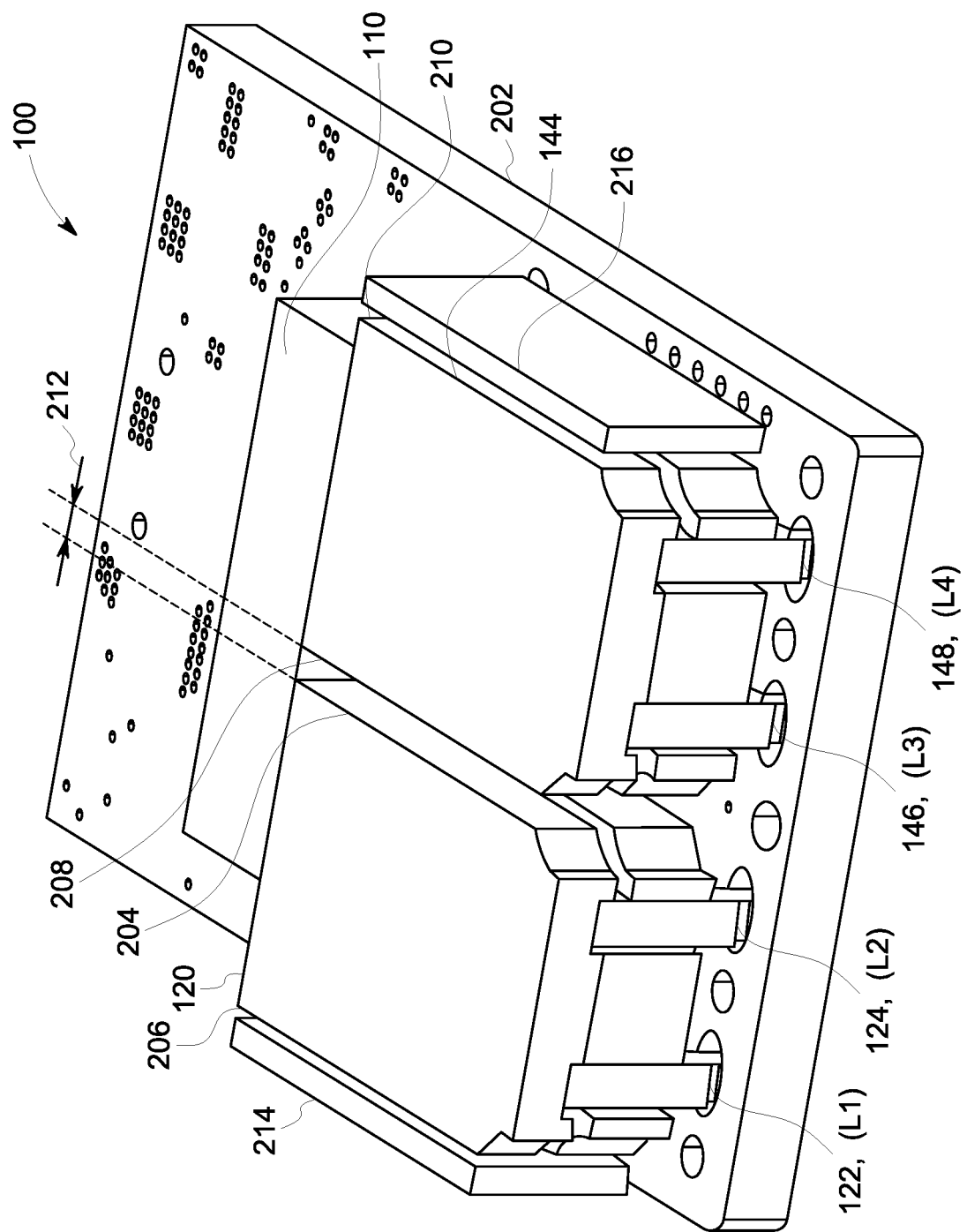
FIG. 2 is a perspective view of an exemplary physical embodiment of the inductively balanced power supply circuit shown in FIG. 1.

FIG. 2 is a perspective view of an exemplary physical embodiment of power supply circuit 100 (shown in FIG. 1). As shown, power supply circuit 100 includes a printed circuit board (PCB) 202, upon which the components described with respect to FIG. 1 are mounted. Specifically, first inductor assembly 120 and second inductor assembly 144 are mounted on PCB 202. In addition, transformer core 110 is mounted on PCB 202 and positioned relative to first inductor assembly 120 and second inductor assembly 144 as described with reference to FIG. 1. Transformer windings 108, 112, 132, and 136 are present but are not visible in the illustrated view. First inductor 122, second inductor 124, third inductor 146, and fourth inductor 148 are also shown, although only in part (see FIG. 3 and the accompanying description below for additional detail).

Physically, first inductor assembly 120 includes an inner edge 204 and an opposite outer edge 206. Likewise, second inductor assembly 144 includes an inner edge 208 and an opposite outer edge 210. Moreover, as shown, first inductor assembly 120 and second inductor assembly 144 are mounted on PCB 202, such that inner edge 204 of first inductor assembly 120 and inner edge 208 of second inductor assembly 144 are adjacent one another and separated by a gap 212. In the exemplary embodiment, gap 212 is approximately 1.6 millimeters. In other embodiments, gap 212 is any distance less than 6.0 millimeters. In yet another embodiment, gap 212 is any distance over which second inductor 124 and third inductor 146 are capable of magnetically coupling during operation.

As described in greater detail below, to compensate for (or balance) the magnetic coupling that occurs between second inductor 124 and third inductor 146, power supply circuit 100 also includes a first magnetic shunt 214 and a second magnetic shunt 216. In general, as described herein, magnetic shunts 214 and 216 electrically conducting elongated members, such as, for example, any ferromagnetic material, such as bars of iron or another soft ferromagnetic material. Specifically, first magnetic shunt 214 and second magnetic shunt 216 are, in the exemplary embodiment, ferrites, such as, for example, any ceramic composition of iron oxide and one or more other metals. In other embodiments, magnetic shunts 214 and 216 are any other ferromagnetic or metallic composition capable of inductively or magnetically coupling with an adjacent inductor 122 and 148, respectively. For example, in some embodiments, magnetic shunts 214 and 216 are any of iron-silicon, iron-nickel, iron-nickel alloys, manganese-zinc, nickel-zinc, and the like.

First magnetic shunt 214 is mechanically coupled to, or mounted on, outer edge 206 of first inductor assembly 120. Similarly, second magnetic shunt 216 is mechanically coupled to, or mounted on, outer edge 210 of second inductor assembly 144. In some embodiments, a thin layer of dielectric, such as a thin layer of adhesive foam or another insulating material, may be positioned between each magnetic shunt 214 and 216 and a respective outer edge 206 and 210.

Moreover, in some embodiments, each magnetic shunt 214 and 216 may be mounted on or coupled to PCB 202 and offset by a small distance (e.g., approximately 0.5 millimeters) from a respective outer edge 206 and 210. In addition, although the dimensions of magnetic shunts 214 and 216 may vary to accomplish a particular mutual inductance, as described below, in the exemplary embodiment, magnetic shunts 214 and 216 have a length approximately equal to a length of outer edges 206 and 210 and a thickness of approximately 1.2 millimeters.

Figure 3:
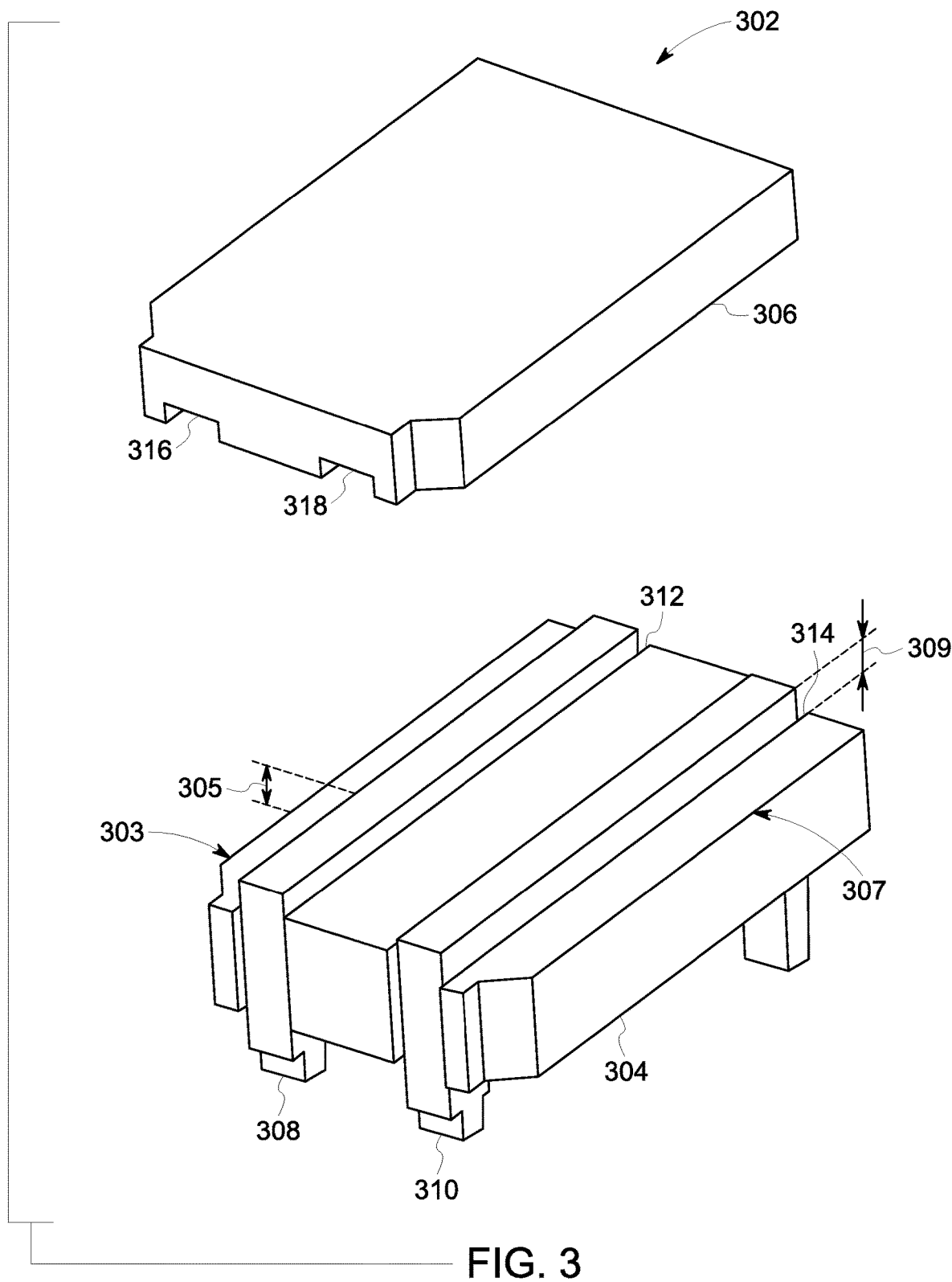
FIG. 3 is an exploded view of an exemplary inductor assembly of the power supply circuit shown in FIG. 1 and FIG. 2.

FIG. 3 is an exploded view of an exemplary inductor assembly 302, such as first inductor assembly 120 and/or second inductor assembly 144 (shown in FIG. 2). As shown, inductor assembly 302 includes a lower core 304, an upper core 306, a first inductor 308, and a second inductor 310. Lower core 304 and upper core 306 may be manufactured from any suitable material or composition of materials, such as, for example, any electrically conducting or ferromagnetic material, including, for example, iron, iron-silicon, iron-nickel, iron-nickel alloys, ceramics, such as ferrites, including, for example, manganese-zinc, nickel-zinc, and the like. First inductor 308 and second inductor 310 may include any suitable inductor, such as any single-turn inductor. In other embodiments, first inductor 308 and/or second inductor 310 are multi-turn inductors.

Lower core 304 includes a first receiving channel 312 and a second receiving channel 314 spaced apart from first receiving channel 312 and oriented parallel to first receiving channel 312. Similarly, upper core includes a third receiving channel 316 and a fourth receiving channel 318 oriented parallel to third receiving channel 316. First receiving channel 312 and third receiving channel 316 are arranged to receive and support first inductor 308. Likewise, second receiving channel 314 and fourth receiving channel 318 are arranged to receive and support second inductor 310. Once first inductor 308 and second inductor 310 are seated or engaged in a respective receiving channel 312, 314, 316, and/or 318, upper core 306 is mounted or coupled over inductors 308 and 310 and/or lower core 304, such that first inductor 308 and second inductor 310 are securely positioned or mounted between lower core 304 and upper core 306. An adhesive, epoxy, and/or another bonding agent may be applied between lower core 304 and upper core 306, such as atop first inductor 308 and second inductor 310, to seal the core halves 304 and 306 together.

In addition, lower core 304 may be separated from upper core 306 along a first edge 303 by a first gap 305. Likewise, lower core 304 may be separated from upper core 306 along a second edge 307 by a second gap 309. More particularly, as described above, first inductor 308 is supported between first receiving channel 312 and third receiving channel 316 and extends a small distance out of first receiving channel 312 towards third receiving channel 316. Likewise, second inductor 310 is supported between second receiving channel 314 and fourth receiving channel 318 and extends a small distance out of second receiving channel 314 towards fourth receiving channel 318. Accordingly, when upper core 306 is coupled to or mounted over lower core 304, upper core 306 rests atop first inductor 308 and second inductor 310, such that first gap 305 and second gap 309 are created between upper core 306 and lower core 304.

Functionally, the inductances of first inductor 308 and second inductor 310 can be controlled by varying the gap length of gaps 305 and 309. Specifically, greater gap lengths reduce the inductance of each inductor 308 and 310 and increase a current handling capacity of each inductor 308 and 310 without saturation. Thus, the inductances and current handling capacities of first inductor 308 and second inductor 310 can be adjusted, in some embodiments, by adjusting the gap length of gaps 305 and 309, such as, for example, by adjusting a depth of receiving channels 312-318 during manufacture and/or by selecting inductors 308 and 310 of varying physical dimensions.

In operation, and as described above, first inductor assembly 120 and second inductor assembly 144 are mounted on PCB 202, such that inner edge 204 of first inductor assembly 120 and inner edge 208 of second inductor assembly 144 are adjacent one another and separated by gap 212. To maintain a suitable power density (e.g., compactness), gap 212 is small (e.g., less than 6.0 millimeters). At such a distance, second inductor 124 and third inductor 146 are able to magnetically couple during operation (recall that second inductor 124 and third inductor 146 operate together during power supply phase B). As a result, a mutual inductance between second inductor 124 and third inductor 146 is established, and this mutual inductance is greater than a self-inductance of the remaining first inductor 122 and fourth inductor 148, which are spaced far enough apart that they do not magnetically couple on their respective power supply phase (Phase A).

In addition, because the parallel inductance of second inductor 124 and third inductor 146 suffers from, or is affected by, a mutual inductance established between these inductors 124 and 146, an output current during power supply Phase B is not equal (without compensation) to an output current during the power supply phase associated with first inductor 122 and fourth inductor 148 (e.g., power supply Phase A). Specifically, the peak-to-peak current on power supply Phase B (associated with second and third inductors 124 and 146) is less than the peak-to-peak current on power supply phase A (associated with first and fourth inductors 122 and 148).

Accordingly, to compensate for the imbalance in output currents on each power supply phase, first magnetic shunt 214 is mounted close to outer edge 206 of first inductor assembly 120, such that first inductor 122 magnetically couples with first magnetic shunt 214 while it is conducting electrical current. Similarly, second magnetic shunt 216 is mounted close to outer edge 210 of second inductor assembly 144, such that fourth inductor 148 magnetically couples with second magnetic shunt 216 while it is conducting electrical current.

As a result of the addition of first magnetic shunt 214 and second magnetic shunt 216, the peak-to-peak output current during the power supply phase associated with first and fourth inductors 122 and 148 (Phase A) is reduced to a level that is close to, or the same as, the peak-to-peak output current during the power supply phase associated with second and third inductors 124 and 146 (Phase B). This is because mutual inductances are intentionally established for first and fourth inductors 122 and 148 by the addition of magnetic shunts 216 and 216 to balance the mutual inductance established as a byproduct of the small gap 212 between second and third inductors 124 and 146.

Further, experimental data collected for power supply circuit 100 indicates that each pair of parallel connected inductors has a parallel inductance (including their respective mutual inductances) during a conducting phase of approximately 85 nH and a parallel inductance during a non-conducting phase of approximately 120-170 nH. In other words, during Phase A, first and fourth inductors 122 and 148 have a parallel inductance of approximately 85 nH, while second and third inductors 124 and 146 have a parallel inductance of approximately 120-170 nH. Similarly, during Phase B, second and third inductors 124 and 146 have a parallel inductance of approximately 85 nH, while first and fourth inductors 122 and 148 have a parallel inductance of approximately 120-170 nH.

Figure 4:
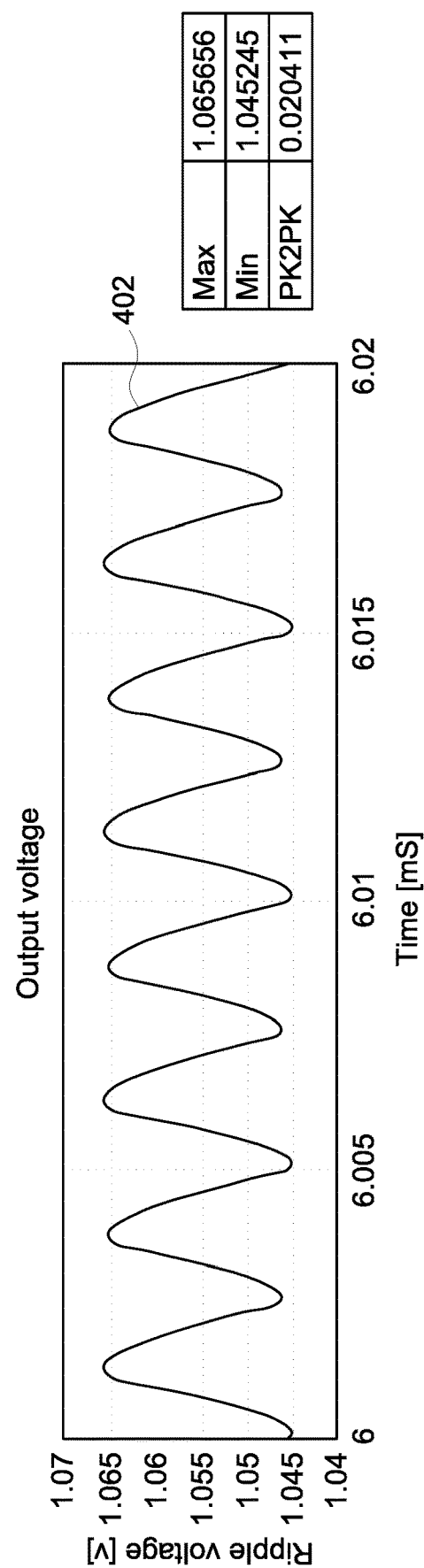
FIG. 4 is a graph showing an exemplary output voltage waveform of the inductively balanced power supply circuit shown in FIG. 1 and FIG. 2.

In addition, when the output currents generated on each power supply phase are combined on output current bus 125, the ripple voltage on the bus 125 is substantially reduced (e.g., in comparison to a ripple voltage that would result otherwise). This is depicted at FIG. 4, which shows a graph of exemplary output voltage waveform 402 of the inductively balanced power supply circuit 100 (shown in FIG. 2). Specifically, as shown, the ripple voltage of power supply circuit 100 ranges from approximately 1.045 volts to approximately 1.065 volts. In other words, the output voltage of power supply circuit 100 is extremely stable; the ripple voltage is only about 0.02 volt (or 20 millivolts).

Moreover, although not shown, the input voltage of power supply circuit 100 is approximately forty-eight volts, and the output current of power supply circuit 100 (which, again, includes two current-doublers 102 and 104) is approximately two-hundred-and-thirty amps. Thus, power supply circuit 100 is capable of converting an input voltage at a ratio of 48:1, includes an output current of in the range of two-hundred-and-thirty amps, and maintains a very small ripple voltage on its output of approximately 20 millivolts.

Figure 5:
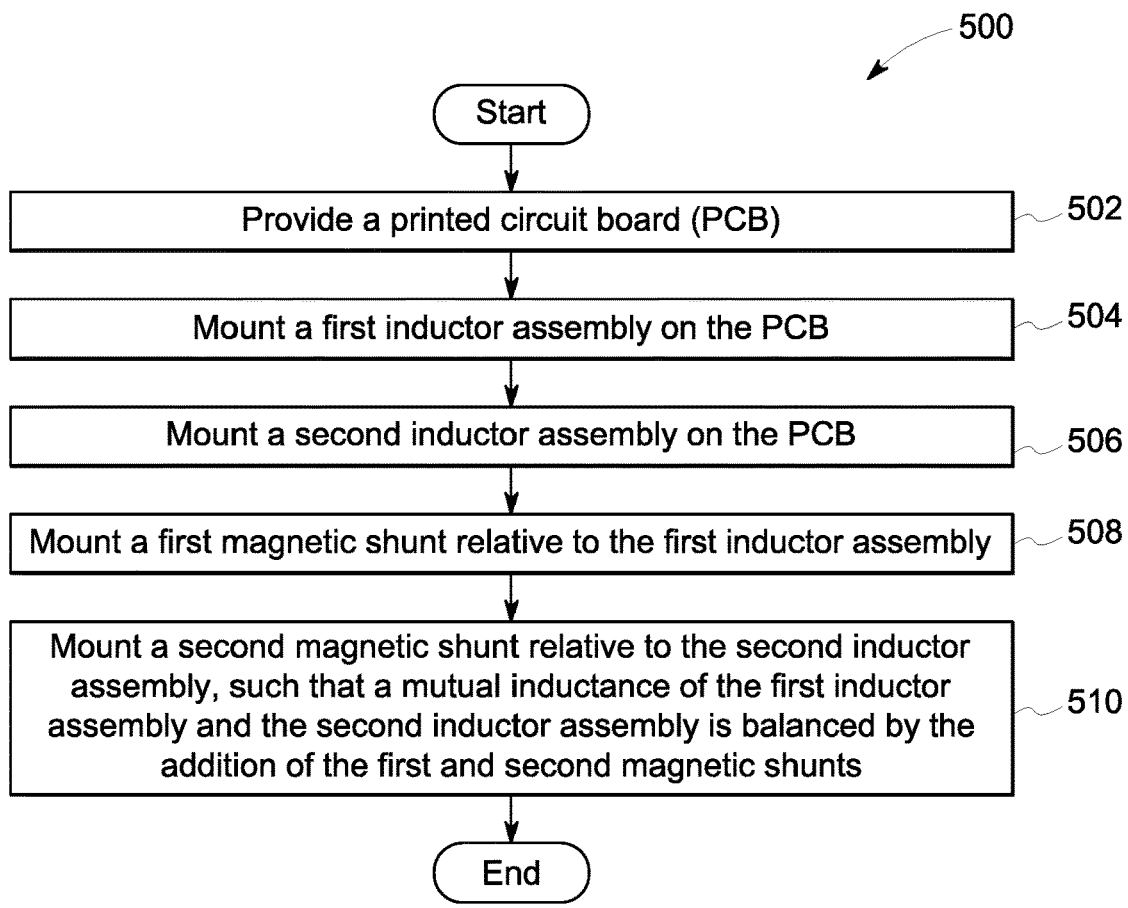
FIG. 5 is a flowchart illustrating a process for inductively balancing the power supply circuit shown in FIG. 1 and FIG. 2.

FIG. 5 is a flowchart illustrating a process for inductively balancing power supply circuit 100 (shown in FIGS. 1 and 2). More particularly, FIG. 5 illustrates a process for initially balancing power supply circuit 100, such as, for example, by a process of trial and error selection of one or more magnetic shunts. Accordingly, to initially balance power supply circuit 100, PCB 202 is provided (step 502). First inductor assembly 120 and second inductor assembly 144 are mounted on PCB 202, such as by a snap-fit and/or soldering procedure (steps 504 and 506). Finally, first magnetic shunt 214 is mounted or mechanically coupled to PCB 202 and/or first inductor assembly 120 as described above (step 508), and second magnetic shunt 216 is mounted or mechanically coupled to PCB 202 and/or second inductor assembly 144, also as described above (step 510). When assembly is complete, one or more measurements may be taken to determine whether power supply circuit is inductively balanced. If so, the sizes and/or other characteristics of magnetic shunts 214 and 216 may be stored for use, as described below with respect to FIG. 6. If not, magnetic shunts 216 and 216 of other sizes and/or having one or more other characteristics (e.g., other magnetic characteristics) may be tried until power supply circuit is inductively balanced.

Figure 6:
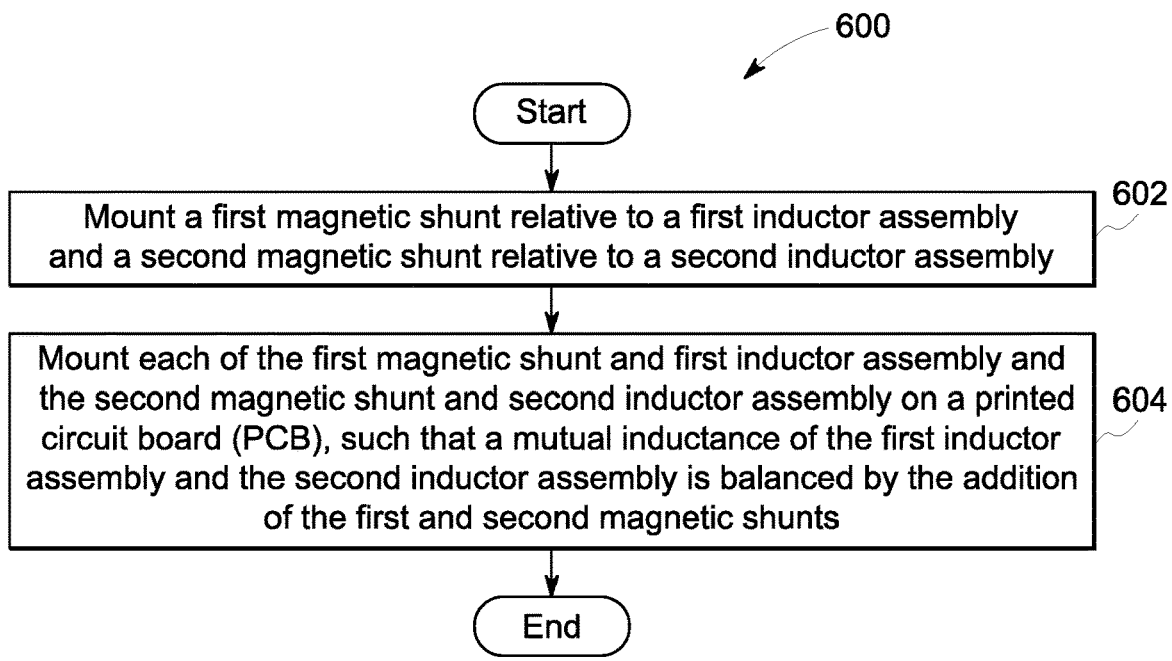
FIG. 6 is a flowchart illustrating a process for assembling an inductively balanced power supply circuit.

FIG. 6 is a flowchart illustrating a process 600 for assembling an inductively balanced power supply circuit 100, such as based on the trial and error analysis performed and described above with respect to FIG. 5. In the exemplary embodiment, process 600 may be performed and/or implemented during a manufacturing and/or production cycle and/or as part of a process of retrofitting an existing power supply circuit. Accordingly, in at least some embodiments, power supply circuit 100 may be inductively balanced by mounting or coupling first magnetic shunt 214 relative to first inductor assembly 120, and by mounting or coupling second magnetic shunt 216 relative to second inductor assembly 144, as describe herein (step 602). Next, each shunt-inductor pair (e.g., first magnetic shunt 214 and first inductor assembly 120 and second magnetic shunt 216 and second inductor assembly 144) may be mounted on PCB 202, such that a mutual inductance of first inductor assembly 120 and second inductor assembly 144 is balanced by the addition of first and second magnetic shunts 214 and 216 (step 604).

Embodiments of the present disclosure thus relate to an inductively balanced power supply circuit, such as a double current-doubler. The power supply circuit includes a first inductor assembly that includes a first inductor and a second inductor, and a second inductor assembly that includes a third inductor and a fourth inductor. The inductor assemblies are positioned close to one another on a printed circuit board, such that the second and third inductors are able to magnetically couple during operation. This form factor increases the power density of the power supply circuit. To balance the mutual inductance established between the second and third inductors, a first magnetic shunt is added in proximity to the first inductor, and second magnetic shunt is added in proximity to the fourth inductor.

Exemplary technical effects of the systems and methods described herein include, for example: (a) an inductively balanced double current-doubler power supply circuit; (b) a power supply circuit capable of a 48:1 power conversion ratio (e.g., 48 volts to 1 volt), and an output current of approximately 230 amps; and (c) an output voltage having a ripple limited to approximately 20 millivolts.

Exemplary embodiments of a power supply circuit and related components are described above in detail. The power supply circuit is not limited to the specific embodiments described herein, but rather, components of systems and/or steps of the methods may be utilized independently and separately from other components and/or steps described herein. For example, the configuration of components described herein may also be used in combination with other processes, and is not limited to practice with the systems and related methods as described herein. Rather, the exemplary embodiment can be implemented and utilized in connection with many applications where DC-DC power conversion is desired.

Although specific features of various embodiments of the present disclosure may be shown in some drawings and not in others, this is for convenience only. In accordance with the principles of the present disclosure, any feature of a drawing may be referenced and/or claimed in combination with any feature of any other drawing.

This written description uses examples to disclose the embodiments of the present disclosure, including the best mode, and also to enable any person skilled in the art to practice the disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power supply circuit comprising:
a printed circuit board (PCB);
a transformer coupled to said PCB;
a first inductor assembly coupled to said PCB and having a first inductor electrically coupled to said transformer for a first phase of an output of the power supply circuit and a second inductor electrically coupled to said transformer for a second phase the output;
a second inductor assembly coupled to said PCB and having a third inductor electrically coupled to said transformer for the second phase of the output and a fourth inductor electrically coupled to said transformer for the first phase of the output, wherein a gap between a first side of said first inductor assembly and a second side of said second inductor assembly is selected to generate a pre-defined mutual inductance between said second inductor and said third inductor;
a first magnetic shunt magnetically coupled to said first inductor that is configured to generate a first portion of the pre-defined mutual inductance; and
a second magnetic shunt magnetically coupled to said fourth inductor that is configured to generate a second portion of the pre-defined mutual inductance,
wherein the first portion and the second portion collectively approximate the pre-defined mutual inductance to reduce a difference in ripple currents in the first phase and the second phase of the output of the power supply circuit.

2. The power supply circuit of claim 1, wherein said first magnetic shunt comprises a ferromagnetic material and wherein said second magnetic shunt comprises a ferromagnetic material.

3. The power supply circuit of claim 1, wherein said first inductor assembly comprises:
a lower core;
an upper core;
a first single-turn inductor mounted between said lower core and said upper core forming said first inductor; and
a second single-turn inductor mounted between said lower core and said upper core forming said second inductor.

4. The power supply circuit of claim 3, wherein said upper core and said lower core comprise dielectrics.

5. The power supply circuit of claim 1, wherein the gap is less than approximately 6.0 millimeters.

6. The power supply circuit of claim 1, wherein the gap is approximately 1.6 millimeters.

7. The power supply circuit of claim 1, wherein said first inductor and said second inductor are electrically connected to a first secondary winding of said transformer and form a portion of a first current-doubler, and wherein said third inductor and said fourth inductor are electrically connected to a second secondary winding of said transformer and form a portion of a second current-doubler.

8. A power supply circuit comprising:
a printed circuit board (PCB);
a first inductor assembly coupled to said PCB and having a first inductor and a second inductor;
a second inductor assembly coupled to said PCB and having a third inductor and a fourth inductor, wherein a gap between a first side of said first inductor assembly and a second side of said second inductor assembly is selected to generate a pre-defined mutual inductance between said second inductor and said third inductor;
a first magnetic shunt magnetically coupled to said first inductor that is configured to generate a first portion of the pre-defined mutual inductance; and
a second magnetic shunt magnetically coupled to said fourth inductor that is configured to generate a second portion of the pre-defined mutual inductance,
wherein the first portion and the second portion collectively approximate the pre-defined mutual inductance to reduce a difference in ripple currents in said first inductor and said fourth inductor.

9. The power supply circuit of claim 8, wherein said first magnetic shunt comprises a ferromagnetic material, and wherein said second magnetic shunt comprises a ferromagnetic material.

10. The power supply circuit of claim 8, wherein said first inductor and said second inductor are each mounted between a lower core and an upper core, and wherein said first inductor and said second inductor are single turn inductors.

11. The power supply circuit of claim 8, wherein said third inductor and said fourth inductor are each mounted between a lower core and an upper core, and wherein said third inductor and said fourth inductor are single turn inductors.

12. The power supply circuit of claim 8, wherein the gap is less than approximately 6.0 millimeters.

13. The power supply circuit of claim 8, wherein the gap is approximately 1.6 millimeters.

14. The power supply circuit of claim 1, wherein said second inductor assembly comprises:
a lower core;
an upper core;
a first single-turn inductor mounted between said lower core and said upper core forming said third inductor; and
a second single-turn inductor mounted between said lower core and said upper core forming said fourth inductor.

15. The power supply circuit of claim 14, wherein said upper core and said lower core comprise dielectrics.

16. The power supply circuit of claim 10, wherein said upper core and said lower core comprise dielectrics.

17. The power supply circuit of claim 11, wherein said upper core and said lower core comprise dielectrics.

* * * * *